(12) United States Patent
Xiao

(10) Patent No.: US 9,647,673 B2
(45) Date of Patent: May 9, 2017

(54) CONTROLLABLE CIRCUITS, PROCESSES AND SYSTEMS FOR FUNCTIONAL ESD TOLERANCE

(71) Applicant: TEXAS INSTRUMENTS INCORPORATED, Dallas, TX (US)

(72) Inventor: Yanyang Xiao, Bellaire, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/165,411

(22) Filed: May 26, 2016

(65) Prior Publication Data

US 2016/0277034 A1 Sep. 22, 2016

Related U.S. Application Data

(63) Continuation of application No. 13/330,940, filed on Dec. 20, 2011, now Pat. No. 9,379,540.

(60) Provisional application No. 61/430,354, filed on Jan. 6, 2011, provisional application No. 61/427,051, filed on Dec. 23, 2010.

(51) Int. Cl.
*H02H 9/00* (2006.01)
*H03L 7/14* (2006.01)
*H02H 9/04* (2006.01)
*H03K 19/173* (2006.01)
*H03L 7/18* (2006.01)

(52) U.S. Cl.
CPC ............... *H03L 7/14* (2013.01); *H02H 9/046* (2013.01); *H03K 19/1737* (2013.01); *H03L 7/18* (2013.01)

(58) Field of Classification Search
USPC .......................................................... 361/56
See application file for complete search history.

(56) References Cited

U.S. PATENT DOCUMENTS

| | | | |
|---|---|---|---|
| 4,280,140 A * | 7/1981 | Skerlos .................... | H03J 7/065 348/735 |
| 4,860,321 A | 8/1989 | von der Embse | |
| 5,329,251 A * | 7/1994 | Llewellyn .......... | G11B 20/1403 331/16 |
| 6,222,652 B1 | 4/2001 | Roberts | |
| 6,400,614 B1 | 6/2002 | Hiromori et al. | |
| 6,647,081 B2 * | 11/2003 | Butler ....................... | H03L 7/06 375/373 |
| 6,895,525 B1 | 5/2005 | Wilkie et al. | |
| 6,898,197 B1 * | 5/2005 | Lavean .................. | H04B 1/707 342/357.64 |

(Continued)

OTHER PUBLICATIONS

TMS570 Transportation Safety Microcontroller Family; Lit. Nr: SPRT545B, 2010, Texas Instruments Inc., Dallas, Texas; pp. 1-2.

*Primary Examiner* — Ronald W Leja
(74) *Attorney, Agent, or Firm* — John R. Pessetto; Charles A. Brill; Frank D. Cimino

(57) ABSTRACT

An electronic circuit (100) includes a first circuit (140) having an output and operable to give a warning but that has a sensitivity to an electrostatic discharge (ESD) event, a second circuit (120) that is operationally at least sometimes coupled with the output of said first circuit (140), whereby subject to some of the sensitivity, and a third circuit (240) interposed between said first circuit (140) and said second circuit (120) and operable to filter out at least one instance of an unnecessary warning so as to reduce the sensitivity to the ESD event.

16 Claims, 10 Drawing Sheets

(56) References Cited

U.S. PATENT DOCUMENTS

| | | | |
|---|---|---|---|
| 6,950,957 B1* | 9/2005 | O'Leary | G06F 1/04 713/401 |
| 7,002,384 B1* | 2/2006 | Chong | H03L 7/0814 327/156 |
| 7,265,634 B2* | 9/2007 | Miki | H03L 3/00 327/159 |
| 7,295,644 B1* | 11/2007 | Wu | H03L 7/0807 375/375 |
| 7,808,075 B1 | 10/2010 | Cheng et al. | |
| 8,067,948 B2 | 11/2011 | Sequine | |
| 9,379,540 B2* | 6/2016 | Xiao | H02H 9/046 |
| 2004/0207464 A1* | 10/2004 | Petrovic | H03D 3/007 329/315 |
| 2005/0013396 A1* | 1/2005 | Kliesner | H03L 7/0814 375/372 |
| 2005/0095992 A1 | 5/2005 | Thompson | |
| 2006/0057996 A1* | 3/2006 | Petrovic | H03D 3/007 455/260 |
| 2006/0208782 A1* | 9/2006 | Sanduleanu | G11C 27/00 327/185 |
| 2006/0209941 A1* | 9/2006 | Kroeger | H03L 7/093 375/222 |
| 2007/0075787 A1 | 4/2007 | Jensen | |
| 2007/0153880 A1 | 7/2007 | Cartmell | |
| 2007/0205833 A1 | 9/2007 | Mar et al. | |
| 2007/0230647 A1 | 10/2007 | Pourbigharaz et al. | |
| 2008/0111633 A1 | 5/2008 | Cranford | |
| 2008/0273460 A1* | 11/2008 | Lamothe | H04L 7/02 370/231 |
| 2009/0161738 A1* | 6/2009 | Carvalho | H04L 25/14 375/219 |
| 2009/0175116 A1* | 7/2009 | Song | G11C 7/22 365/233.12 |
| 2010/0085368 A1 | 4/2010 | Shin et al. | |
| 2010/0208775 A1 | 8/2010 | Weill | |
| 2010/0301814 A1 | 12/2010 | Padiyar | |
| 2010/0315169 A1* | 12/2010 | Filipovic | H03L 7/093 331/11 |
| 2011/0267214 A1 | 11/2011 | Roach | |
| 2011/0273210 A1* | 11/2011 | Nagaraj | H03L 7/0802 327/159 |
| 2012/0162835 A1 | 6/2012 | Xiao | |

* cited by examiner

CONTROLLABLE CIRCUITS, PROCESSES AND SYSTEMS FOR FUNCTIONAL ESD TOLERANCE

CROSS-REFERENCE TO RELATED APPLICATIONS

This continuation application claims priority to U.S. patent application Ser. No. 13/330,940, filed Dec. 20, 2011, which claims priority to and the benefit of U.S. Provisional Patent Application No. 61/430,354, filed Jan. 6, 2011 and U.S. Provisional Patent Application No. 61/427,051, filed Dec. 23, 2010, all of which are incorporated herein by reference in their entirety.

STATEMENT REGARDING FEDERALLY SPONSORED RESEARCH OR DEVELOPMENT

Not applicable.

COPYRIGHT NOTIFICATION

Portions of this patent application contain materials that are subject to copyright protection. The copyright owner has no objection to the facsimile reproduction by anyone of the patent document, or the patent disclosure, as it appears in a governmental patent office to the extent they have a non-copyright right to do so, but otherwise reserves all copyright rights whatsoever.

BACKGROUND

Electrostatic discharge (ESD) protection in the electronic and integrated circuit arts is a technology that attempts to address, among other things, the small sparks and flashes of static electricity that are sometimes encountered by people in dry climates or in drier months of the year, as when walking across a carpet or taking off a garment. These sparks can represent thousands of volts of static electricity that generally involve such low amounts of electrical current that they pose no risk or harm to people, but do call for well-considered protective measures to avoid damage to the microscopically small circuitry elements of today's integrated circuits and electronic devices.

Automotive and other vehicular applications of integrated circuit electronics also need to be resistant to ESD, and ESD without limitation includes herein various kinds of transient noise and electrical discharges regardless of origin. Moreover, industrial environments in which such integrated circuits and system products are made and used can also cause ESD conditions that can cause expensive failures in manufacture and problems in industrial use. In extreme cases the availability of supply, cost of manufacture, and ultimate price of particular integrated circuits and system products could be affected.

ESD events are stealthy and largely unpredictable in their particular circumstances when they happen in the field to a device in use, and their damage would be expensive to fix and prevent at that point even if an exact destroyed or damaged spot in the IC could be found. Furthermore, subtle undesirable interaction effects in circuitry can be caused by ESD, and thus no actual microscopic physical destruction due to ESD may exist. Accordingly, introducing ESD protection measures beforehand is vital to prevent not only ESD damage but also prevent any undesirable operational effects that interfere with the way the circuits are intended to work. However, the wide variety and complexity of integrated circuits and system products also increases the variety of ways that an integrated circuit might fail operationally when subjected to even a specifically-controlled ESD event and even when some basic ESD protection to prevent physical destruction of the chip is present near the pins of the chip.

With the increasingly pervasive presence and significance of personal computers and mobile consumer electronic devices in industrial and personal consumer use, for instance, the importance of recognizing electrostatic discharge conditions and protecting integrated circuits from their effects has never been greater.

Challenges in the ESD protection art continue to present themselves not only as the integrated circuit structures become increasingly complex and sophisticated and microscopically ever smaller, but also as the operations demanded of integrated circuits call for very high rates of speed of digital logic operations and/or executing instructions and data processing with which ESD can interfere. These smaller structures and higher rates of instruction and data processing are supported by fast actuating circuits called clock circuits. To generate the very high clock frequencies that support high-performance electronic devices on the order of hundreds of megahertz or above one gigahertz (billion cycles per second), high frequency clock oscillator circuitry and clock-multiplying phase lock loop (PLL) circuitry are used.

Significant technological departures are needed to solve categories of ESD problems, especially problems associated with the main support and warning circuits, as more specifically described hereinbelow.

SUMMARY OF THE INVENTION

Generally, and in one form of the invention, an electronic circuit includes a first circuit having an output and operable to give a warning but that has a sensitivity to an electrostatic discharge (ESD) event, a second circuit that is operationally at least sometimes coupled with the output of said first circuit, whereby subject to some of the sensitivity, and a third circuit interposed between said first circuit and said second circuit and operable to filter out at least one instance of an unnecessary warning so as to reduce the sensitivity to the ESD event.

Generally, another form of the invention involves a process or method of operating an integrated circuit that can issue an internal warning having a sensitivity to an electrostatic discharge (ESD) event. The method includes imposing of filtering on the issuing of the internal warning for at least one instance of an unnecessary warning so as to reduce the sensitivity to the ESD event.

Generally, and in a further form of the invention, an electronic circuit includes at least two parts of the circuit with an internal warning path between them and the circuit having a sensitivity to an electrostatic discharge (ESD) event, and further includes a reconstituting circuit interposed in the internal warning path and operable to at least temporarily reconstitute a pre-existing signal condition at an output of the circuit onto the internal warning path when a departure from that pre-existing signal condition is sensed at an input of the circuit from the internal warning path.

Generally, an additional form of the invention involves a process or method of manufacturing an integrated circuit including an internal warning line and the circuit having a sensitivity to an electrostatic discharge (ESD) event. The method includes fabricating a filter circuit including programmable counter logic for the internal warning line along with the rest of the integrated circuit, characterizing the integrated circuit, and adjusting the ESD sensitivity of the integrated circuit by programming the programmable counter logic after the integrated circuit is characterized.

Other circuits, devices, systems, methods of operation and processes of manufacture are also disclosed and claimed.

Corresponding numerals in different Figures indicate corresponding parts except where the context indicates otherwise. A minor variation in capitalization or punctuation for the same thing does not necessarily indicate a different thing. A suffix .i or .j refers to any of several numerically suffixed elements having the same prefix.

DETAILED DESCRIPTION OF EMBODIMENTS

Figure 1:
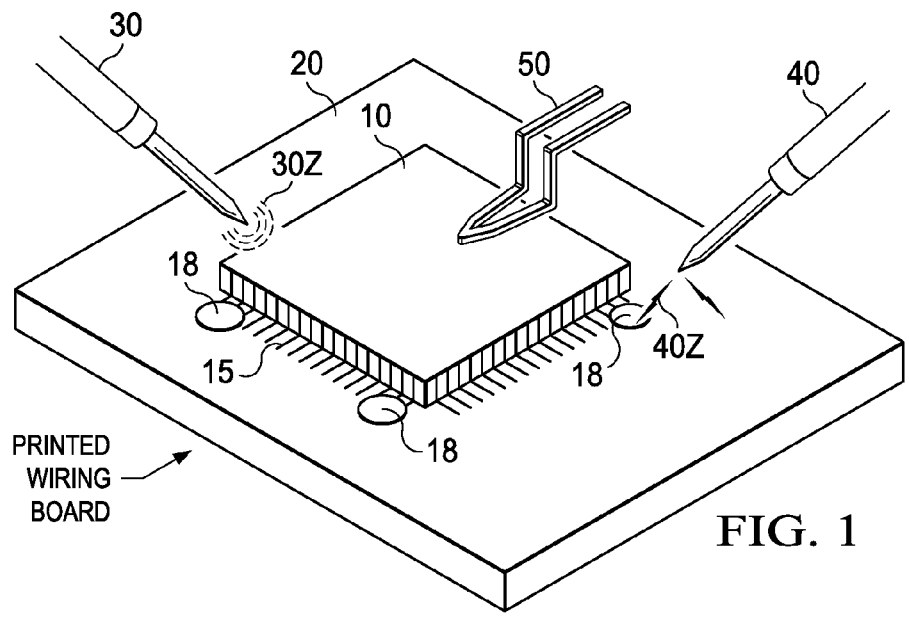
FIG. 1 is a pictorial diagram illustrating ESD tests of an integrated circuit (IC) on a printed wiring board (PWB).

In FIG. 1, an integrated circuit (IC) 10 is mounted on an electrically conductive ground plane 20 at of a printed wiring board PWB to perform in an environment similar to ESD such as when subjected to ESD immunity tests. ESD voltages 30Z, 40Z at 15-20-25-30 kV (kilovolts, thousands of volts) are applied by various electrodes such as ESD test electrodes 30 and 40. For instance, in one type of ESD test an electrode 30 with a round tip applies an electrical air-discharge 30Z like a corona discharge, energizing or ionizing the air and thereby coupling an ESD electrified condition to the plastic or ceramic packaging of IC 10 and to various conductive pins 15 of IC 10. In another type of ESD test, a test electrode 40 having a pointed tip supplies a contact discharge specifically to a given pin 15 of IC 10. In yet another type of ESD test, the test electrode 40 with the pointed tip delivers a spark 40Z into the PWB ground plane 20 near grounded pins of the chip indicated by solder 18 as an electrical attachment to ground plane 20. Spark 40Z causes a ground-loop ESD event or condition wherein ESD electrical currents transiently flow in diverse ways in and through the chip 10 via its ground pins at solder 18. A wire clamp 50 presses against the package of IC 10 in various places and is suitably provided as a further test structure that can supply either or both of physical stress and ESD stress to IC 10.

The semiconductor IC 10 is subjected to any of HBM (human body model), MM (machine model), and CDM (charged device model) ESD tests. HBM involves a capacitor discharging a limited amount of electrical charge through an electrical resistance as if from the human body to the IC 10 or device. The machine model MM involves a capacitor discharging through negligible resistance, as if from an industrial machine or automotive engine, to the IC 10 or device. The charged device model CDM gradually applies a high voltage over the device itself as if the device were passing through a conveyor machine and makes the device become electrically charged generally, and then the CDM test causes the charge on the IC 10 or device to discharge by touching a grounded object. For some background on HBM, MM, and CDM see "Device Sensitivity and Testing, mostly" The ESD Association, Compliance Engineering. http://www.ce-mag.com/99ARG/ESD%20Assoc185.html Air discharge 30Z and contact discharge 40Z events may be applied for indirect and direct discharges to the integrated circuit 10. In a static ESD test, a test condition is: IC power off. Failure criterion: damaged or not. By contrast, in a functional ESD test, the test condition powers up and activates the IC 10 in an operating mode. Failure criteria are: Impact on the functionality of the IC 10 device during or after the measurements.

System ESD is distinguished from static ESD. For example a test device called a zapper gun introduces ESD ground loop voltages in metal parts of a circuit board and system. The ESD shots or zaps not only can affect signal pins 15 and circuits in their microscopic vicinity but also enter the functional circuitry in the interior of IC 10. The ESD shots may introduce unexpected functional and test signals in various places of an unprotected IC 10, thereby stimulating or reproducing conditions that could also arise unexpectedly in use conditions in the field. Thus ESD testing as in FIG. 1 valuably reveals opportunities for additional protection for, and improved design of, integrated circuits, printed wiring boards and electronic systems generally.

Figure 2:
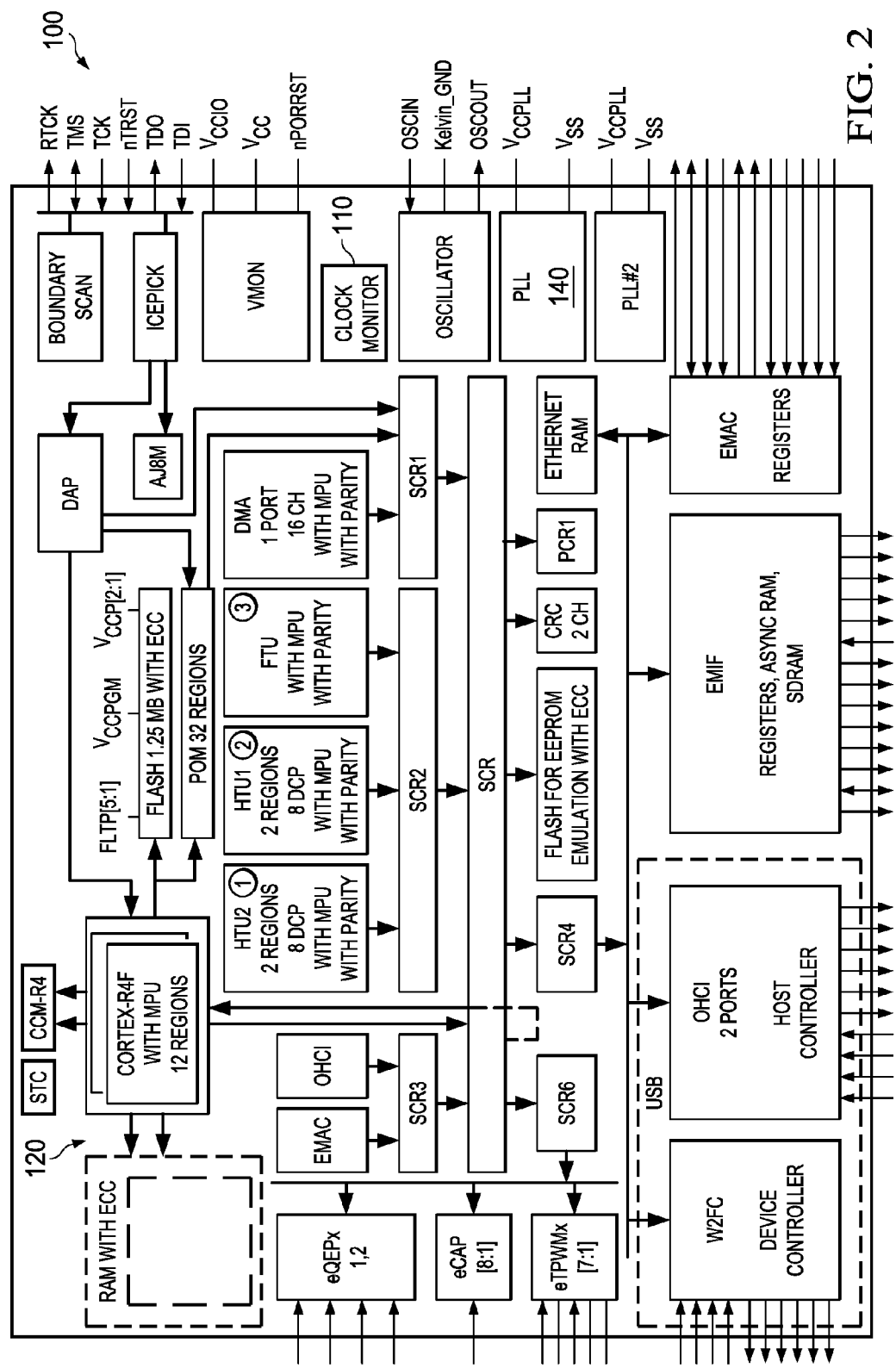
FIG. 2 is a block diagram of one example of an integrated circuit system-on-chip (SoC) that can be subject to ESD conditions as in FIG. 1.

TABLE 1 provides a glossary for use in describing FIG. 2 and other Figures.

TABLE 1

GLOSSARY OF ACRONYMS AND
EMBEDDED ABBREVIATIONS

| | |
|---|---|
| CLK | Clock |
| CNT | Count |
| CONFIG | Configure, configuration |
| DAP | Debug port |
| DET | Detection, detector |
| DIV | Divide |
| e | Enhanced |
| eCAP | Enhanced Capture |
| eQEP | Enhanced Quadrature Encoder |
| EMAC | Enhanced Media Access Controller |
| EMIF | External memory interface |
| EN | Enable |
| ESD | Electrostatic discharge |
| HFLPO | High Frequency LPO |
| LPO | Low Power Oscillator |
| OSC | Oscillator |
| PLL | Phase lock loop |
| PMT | Parallel module test mode |
| POR | Power on reset |
| PWM | Pulse Width Modulation (eTPWMx peripheral) |
| PWRDN | Power down |
| RST | Reset |
| SCR | Switch Central Resource (arbitration) |
| SIG | Signal |
| SYS | System |
| TU | Transfer Unit |
| V | Voltage. V may refer to VBUS instead |
| VCLK | Bus clock for VBUS to peripherals |
| VMON | Voltage monitor |

In FIG. 2, a microcontroller 100 example of IC 10 is depicted as a placeholder for any of numerous ICs 10 that can be ESD protected by embodiments herein. At center-right, a clock oscillator OSC or clock input buffer for external oscillator input OSCIN is coupled with a Clock Monitor Wrapper circuit embodiment 110 of FIGS. 3-10 as well as phase lock loop blocks 140 designated PLL and PLL#2 associated with the Clock Monitor Wrapper circuit 110. A voltage monitor circuit VMON monitors power voltages VCC and VCCIO and has power-on reset lines nPORRST. Debug circuitry includes a Boundary Scan circuit and ICEPICK™ in-circuit emulation circuitry coupled with blocks for debug DAP and AJ8M.

In FIG. 2, the functional circuitry 120 includes two processor cores that run software approximately in parallel in an error checking mode supported by a comparator CCM (illustrated in FIG. 11) and ECC (error correcting code) protected local RAM. An arbitration circuit SCR couples to the processor cores and is supported by arbitration subcircuits SCR1, SCR2, SCR3, SCR4, SCR6 to provide further couplings with various peripherals. SCR1 couples and arbitrates POM (parameter overlay module for flash patches), DMA (direct memory access), DAP (debug port) with priorities in 1-2-3 order respectively for SCR. SCR couples to on-chip ECC flash and CRC (cyclic redundancy checksum controller). SCR couples to the other SCRi, which operate round-robin. SCR2 couples memory regions designated FTU, HTU1, and HTU2 with SCR. SCR3 couples EMAC and OHCI with SCR. SCR4 couples SCR with Ethernet RAM, EMAC, EMIF (extended memory interface to off-chip memory such as SDRAM), OHCI open host controller interface, and device controller W2FC. SCR6 couples SCR with eQEPx, eCAP and eTPWMx.

Figure 3:
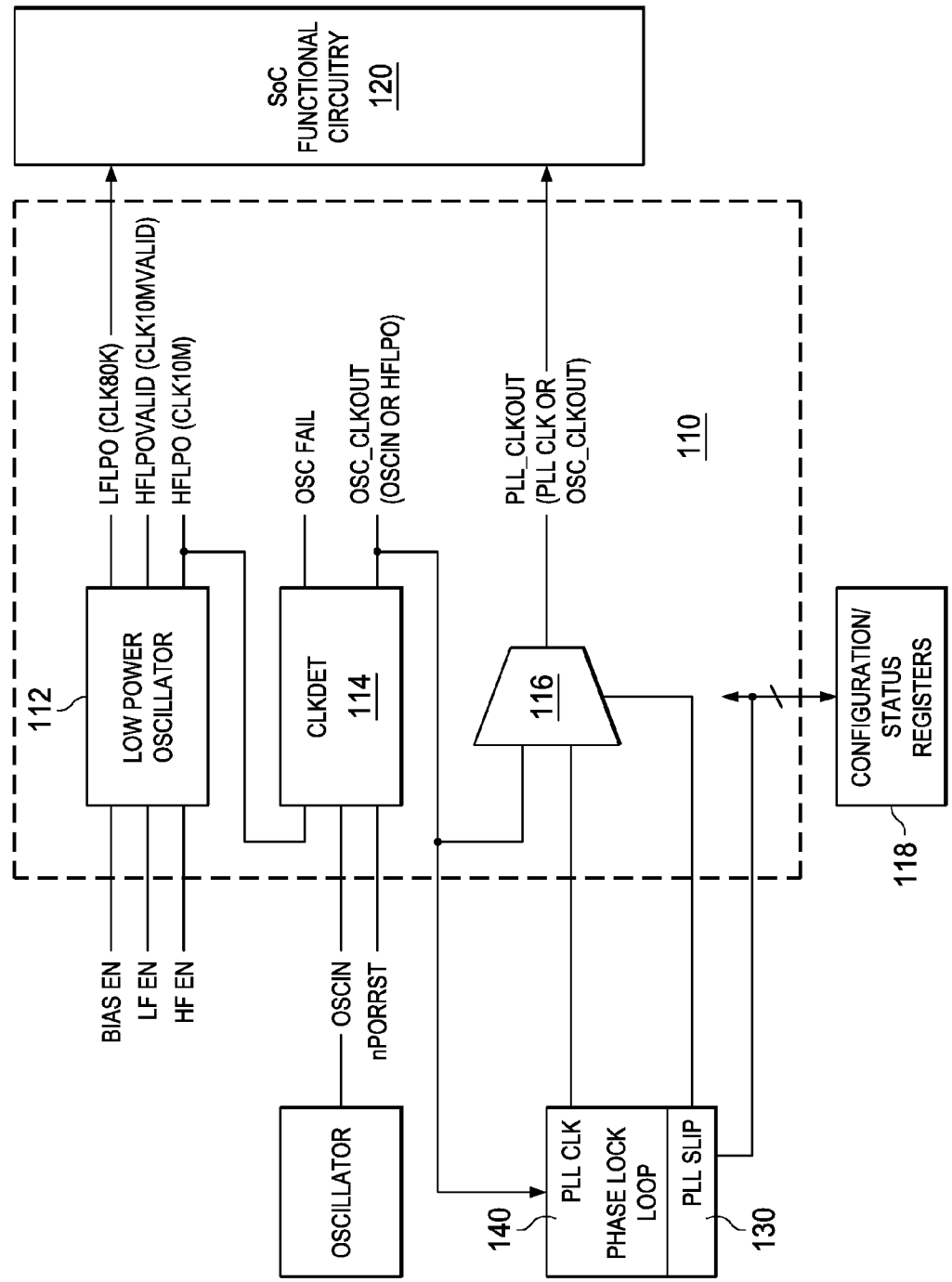
FIG. 3 is a block diagram of a clock monitor wrapper circuit coupled with functional circuitry of the integrated circuit in FIG. 2.

In FIG. 3, a PLL macro 140 includes slip detection logic 130 that indicates whether the PLL has lost lock between the output frequency and the input reference frequency. System registers 118 include a status flag that is set when slip detection logic 130 indicates an over cycle slip (RFSLIP bit) and a separate flag that indicates an under cycle slip (FBSLIP bit). The response that Clock Monitor Wrapper circuit 110 should make to a PLL slip warning signal is influenced or structured by configuration of system module registers 118 in this embodiment of FIGS. 3-5. If a control enable bit for activating use of PLL_SLIP is not set, then the system only captures the PLL slip condition in a status register among registers 118. If the control enable bit for PLL_SLIP is set and a Reset On PLL Slip (ROS) bit is not set, then if the warning represented by PLL_SLIP goes active a mux 116 switches any clock domain in the functional circuitry 120 that uses the main PLL 140 output as its source to instead use the primary oscillator output from a CLKDET module 114 and continue operation. If both control enable bit for PLL_SLIP bit and the Reset On PLL Slip (ROS) bit are set, a system reset is generated whenever a PLL slip condition is detected and the warning PLL_SLIP made active. This reset condition is also flagged using an Oscillator Reset status bit (OSC RST) in a status field of registers 118. After the reset, the clock monitor mux 116 forces any clock domain in functional circuitry 120 selecting the main PLL output as its source to instead use the primary oscillator output from the CLKDET module 114. Evidently, the warning represented by PLL_SLIP should desirably be as error-free as possible. ESD and interference conditions pose an important challenge that is addressed by the embodiments herein.

Figure 14:
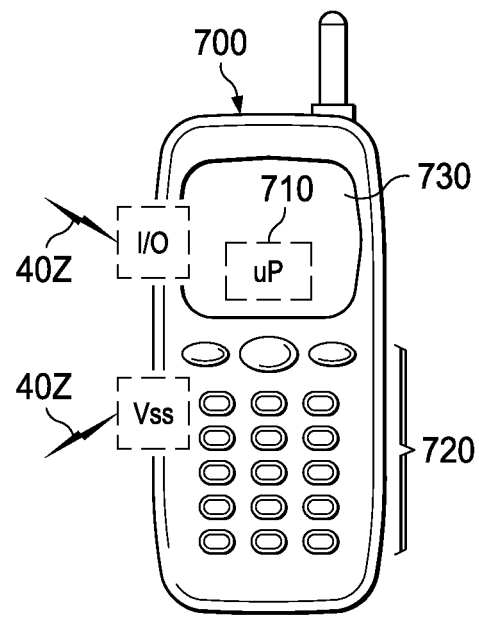
FIG. 14 is a partially-pictorial, partially-block diagram of a mobile electronic device embodiment for increased ESD tolerance as further detailed in the other Figures.
Figure 15:
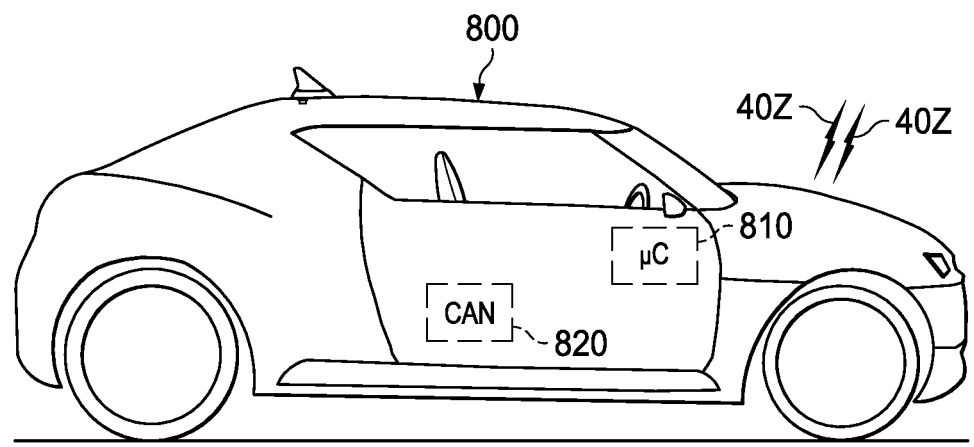
FIG. 15 is a partially-pictorial, partially-block diagram of a vehicle electronic system embodiment for increased ESD tolerance as further detailed in the other Figures.

The clock oscillator outputs from mux 116 to system on chip (SoC) functional circuitry 120 support the functional circuit operations and applications of chip 100, and indeed a system using chip 100 such as a mobile device of FIG. 14 or automotive system of FIG. 15. To generate the very high clock frequencies that support high-performance electronic devices on the order of hundreds of megahertz or above one gigahertz (billion cycles per second), high frequency clock oscillator OSC circuitry and clock-multiplying phase lock loop (PLL) circuitry 140 are used.

TABLE 2 lists some explanatory information for several lines in FIGS. 3-5 and FIG. 9.

TABLE 2

LIST OF SOME LINES

| | |
|---|---|
| PLLCLK | Divided VCOCLK |
| CLKOUTX2 PLL | Undivided 2x clock output. This clock maps to PMT output clock interface to specify a current-handling output buffer. |
| nPORST | nPORST delayed by 2^m OSC CLK cycles |
| nRST | nPORST delayed by 2^m + some extra OSC CLK cycles |
| post_ODCLK | Divided VCOCLK from first output divider '/OD' |
| OSC_VALID | Oscillator valid signal |
| PLL_VALID | PLL valid |
| RFSLIP | Reference cycle over cycle slip output (VCOCLKfrequency high) |
| FBSLIP | Feedback cycle under cycle slip output (VCOCLKfrequency low) |
| PLL_SLIP | Combines FBSLIP & RFSLIP PLL lines. |
| RFEN | Clock enable to synchronize inputs to PLL macro. |
| FBEN | Clock enable to synchronize inputs to PLL macro. |
| OSCRES | Oscillator power down, reset |
| VCOCLK | Voltage controlled oscillator output in PLL |

Figure 9:
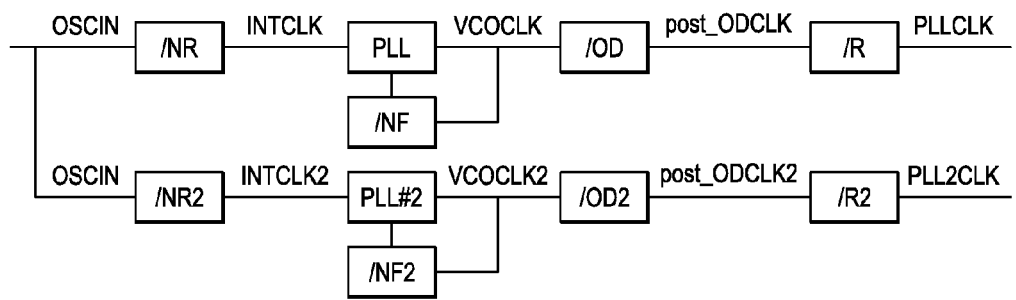
FIG. 9 is a block diagram depicting more detail of PLL-based clock circuitry in the clock monitor wrapper circuit of FIG. 4.

In FIG. 3, main oscillator OSC supplies OSCIN as primary clock for the IC 10 and is clock to the PLL macro 140 that includes blocks PLL and PLL#2 of FIGS. 2 and 9. The Clock Monitor Wrapper module 110 is a wrapper around an on-chip low power oscillator LPO 112 and a Clock Detect module CLKDET 114, which generate the controls for PLL limp clock OSC_CLKOUT (named as if module 110 were limping along) when there is a PLL slip or oscillator OSC fail.

Further describing FIG. 3, the Clock Monitor Wrapper circuit 110 includes the clock detector CLKDET 114 that is responsive to an input OSCIN from oscillator OSC and control circuits that provide control input signals thereto. The low-power oscillator LPO 112 provides a low-frequency LFLPO output and couples a high-frequency HFLPO output to an input of clock detector CLKDET 114. HFLPO_CLK is the high-frequency output, e.g. several MHz or more from the internal reference oscillator LPO 112 and used by clock detector CLKDET 114 as a reference clock to monitor the main oscillator OSC frequency. Clock detector CLKDET 114 compares the inputs HFLPO and OSCIN to make sure that both these clock sources are working, otherwise CLKDET 114 delivers a protective control OSC_FAIL to protective logic for the chip 100. HFLPO is used as a backup clock for output OSC_CLKOUT. Ordinarily, OSCIN is satisfactorily clocked, and clock detector CLKDET 114 passes OSCIN to an output OSC_CLKOUT that is also conveyed as a time-base for PLL 140 to lock onto. Output OSC_CLKOUT further goes to a first input of clock monitor mux 116, and output PLL_CLK from PLL 140 goes to a second input of mux 116.

In adverse conditions, the PLL circuitry 140 may be subject to PLL slip, also called PLL cycle slip, such as when PLL 140 fails to keep time by not running at the clock rate expected of it or intended for it. PLL control logic 130 responds and generates a signal PLL_SLIP that controls the selection of a clock mux 116 that e.g., delivers PLL_CLK or OSC_CLKOUT to SoC functional circuitry 120. The SoC functional circuitry 120 can thus be switched by mux 116 between clock sources (such as PLL, PLL#2 or otherwise) if the PLL is not functioning as desired, such as in cases of instances of actual PLL slip. Electrically conductive clock circuit lines fan out from Clock Monitor Wrapper 110 all over the functional circuitry 120 to support the functional circuitry 120. Therefore, reliable control and operation of the clock circuitry of the Clock Monitor Wrapper circuit 110 and PLL/PLL2 140 is very important. Conversely, sustained disturbance to the PLL circuitry 140 should not be propagated widely to SoC functional circuitry 120 lest it consequently cause undesirable effects on SoC operation.

Accordingly, accurate detection of instances of such disturbance to the PLL circuitry 140 is important so that, on one hand, a disturbance is not detected when it is actually absent and, on the other hand, a disturbance is detected but substantially only detected when it is actually present. If a PLL_SLIP signal could be generated by an ESD condition when in fact the PLL 140 is free of any system-significant PLL slip—i.e., if the detection and control circuitry for clocking the chip could be fooled by the ESD condition—then the PLL slip detection circuit 130 would be too conservative under the ESD condition or scenario. Here, the control circuitry in a remarkably-improved Clock Monitor Wrapper circuit 110 should initiate only necessary protective measures that maintain, protect, or affect to minimum extent possible, the performance or functionality of the chip 100, and thereby protect and enhance the user experience.

Various significant technological departures are provided by embodiments to remarkably increase the accuracy of PLL slip detection in the presence of an ESD condition, with attendant benefits to users.

When subjected to functional ESD (electrostatic discharge) events, an application specific IC (ASIC) component or a microprocessor may problematically not be able to tolerate transient faults caused by functional ESD events. Especially, the PLL (phase lock loop) can be sensitive to this type of external events and lose lock. (Lock refers to a desired stable operating condition of the PLL 140 at intended clock rate or frequency.) This can reduce the performance and/or availability of the system, and can risk diminishing the user experience. Various embodiments reduce the sensitivity to ESD events, and improve the availability of the integrated circuit 100 component embodiment.

Some of the embodiments are also made to have programmable tolerance to external functional ESD events.

Figure 5A:
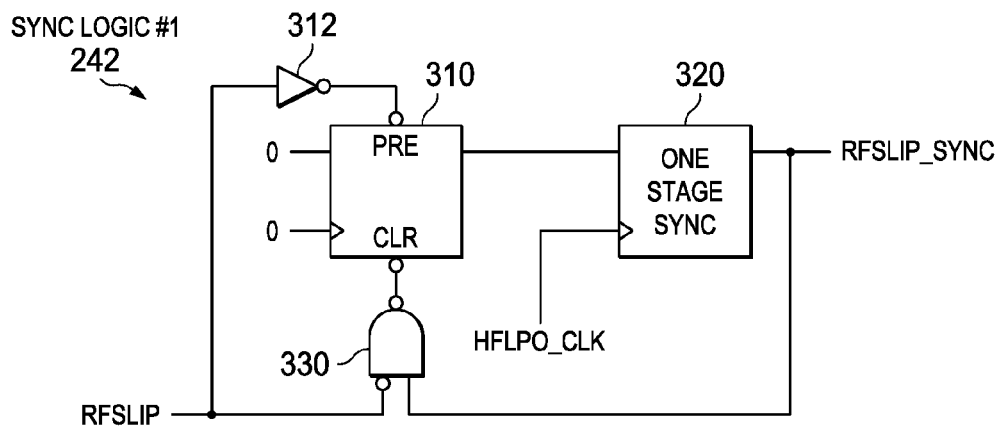
FIG. 5A is a schematic diagram detailing a first synchronizing logic circuit for the embodiment of FIG. 5.
Figure 5B:
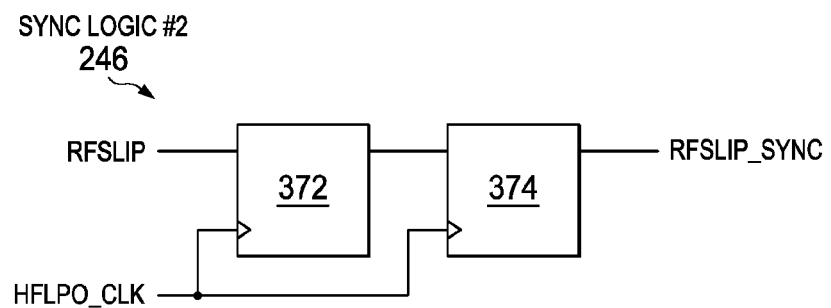
FIG. 5B is a schematic diagram detailing a second synchronizing logic circuit for the embodiment of FIG. 5.
Figure 4:
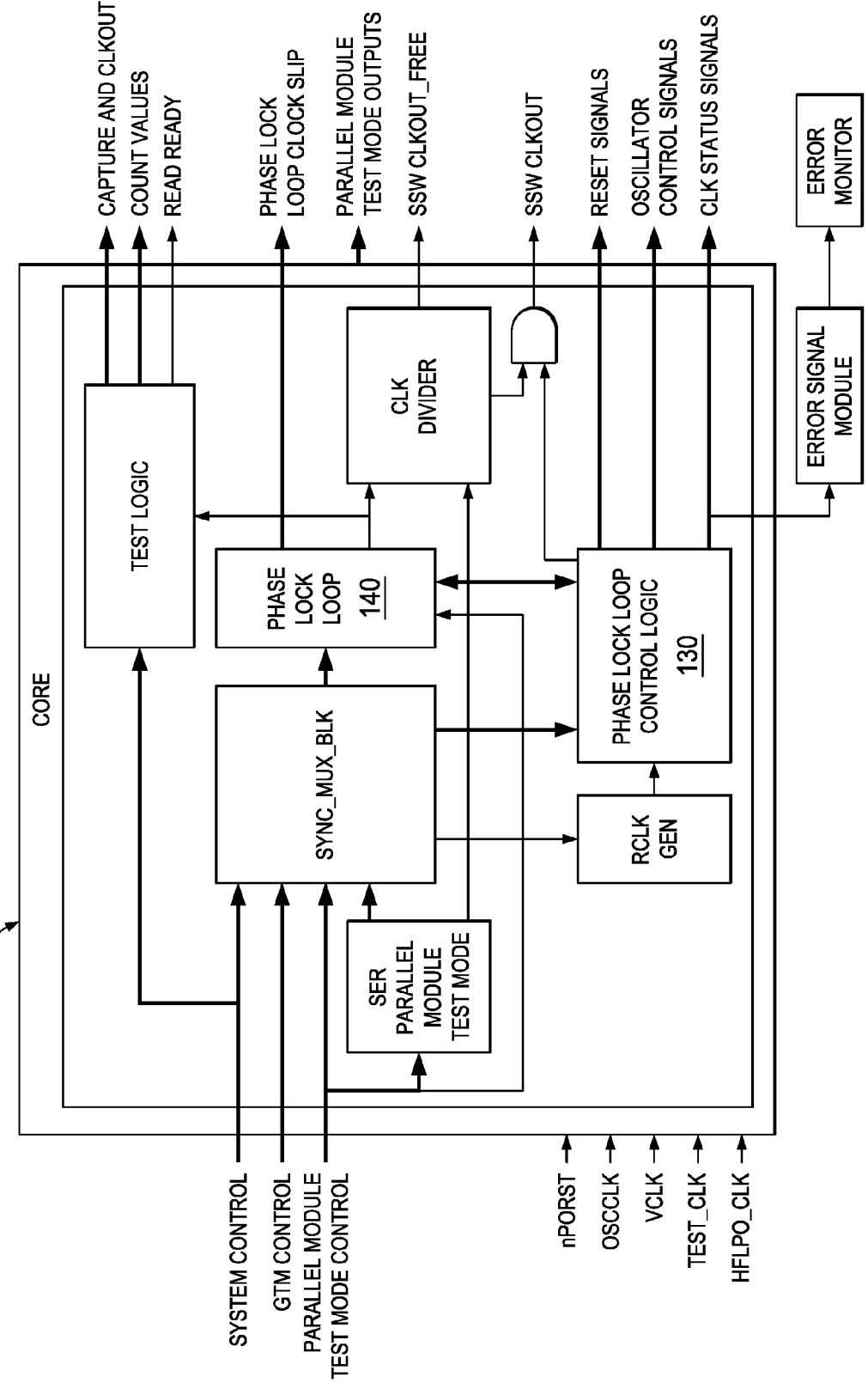
FIG. 4 is a block diagram showing the clock monitor wrapper circuit of FIG. 3 in more detail and improved as in FIG. 5.
Figure 5:
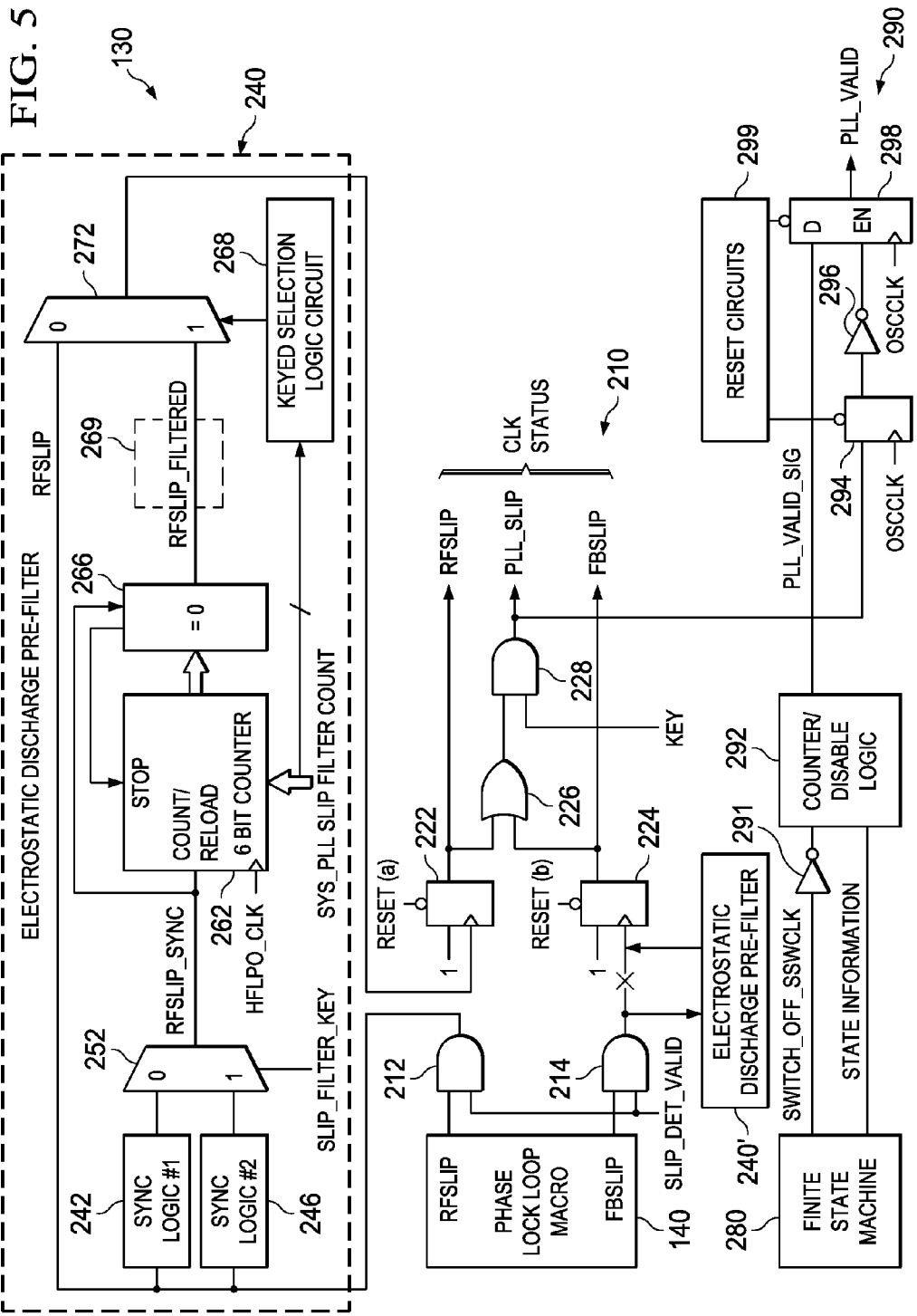
FIG. 5 is a block diagram depicting an embodiment of ESD-tolerant warning circuitry applicable in FIG. 4 and having warning lines filtering or reconstituting circuitry and operable to reduce errors that ESD might cause in PLL warning signals RFSLIP, FBSLIP, and PLL_SLIP.

In some of the embodiments a Clock Monitor Wrapper circuit 110 of FIGS. 2-4 has dramatically improved PLL control logic 130 in FIG. 4 that includes a remarkable ESD Pre-Filter or stabilizing circuit PF 240 shown in FIG. 5. The prefilter PF 240 is included in a PLL_Slip control circuit 210 to decrease the sensitivity of the PLL_Slip control circuit 210 to ESD events without substantially decreasing the sensitivity of that PLL_Slip control circuit 210 to actual instances of a noteworthy, sustained slip in PLL 140 and consequent slip warning(s) from the PLL 140.

Among the advantages of various embodiments, circuit 240 with programmable counter logic 262 as in FIG. 5 is provided, operated and used to filter out possible instances of an unnecessary or erroneous warning emanating from slip detection circuitry associated with the PLL 140 as if from a single-cycle slip or other insignificant slip event but actually caused by ESD interference. The programmable counter logic 262 allows the system to use FIG. 3 registers 118 to fine tune or adjust the sensitivity after an integrated circuit device is characterized such as by ESD testing or other testing. It is by construction able to support dual endian-ness in the microcontroller 100, and promotes safety standards.

Figure 10:
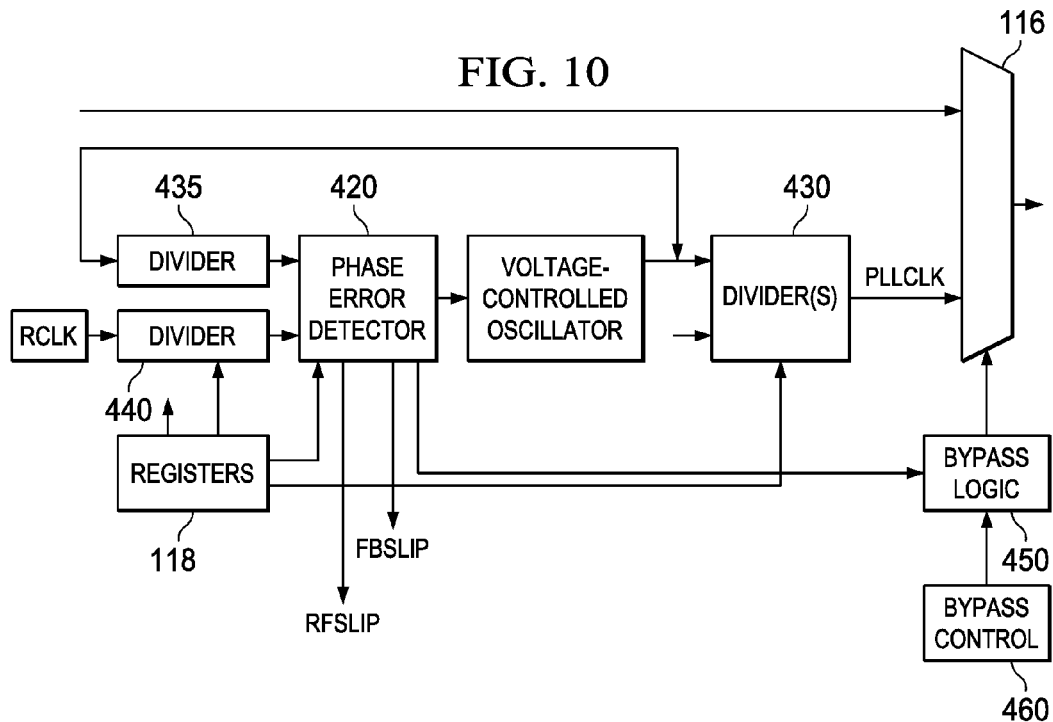
FIG. 10 is a block diagram depicting more detail of a PLL circuit in the PLL-based clock circuitry of FIG. 9.

In FIG. 5, PLL macro 140 includes a PLL as in FIG. 10 and a slip detector that indicates a slip under two different conditions: 1) Reference cycle slip RFSLIP wherein reference clock falls behind the feedback clock by at least one cycle, or 2) Feedback cycle slip FBSLIP wherein feedback clock falls behind the reference clock by at least one cycle.

The Clock Monitor Wrapper module 110 is remarkably improved by providing a configurable filtering circuit 240 on the RFSLIP signal and a similar configurable filtering circuit 240' on the FBSLIP signal. Notice that the designations RFSLIP and FBSLIP are used in multiple places in FIG. 5 and together indicate the warning signal flow and overall internal warning path associated with circuitry 210. Each pre-filter circuit PF 240, PF 240' is put in place so that an unintended RFSLIP or FBSLIP indication caused by, e.g., a few missing reference clocks during an ESD event can be filtered out and not lead to a slip indication PLL_SLIP to the system.

The RFSLIP and FBSLIP signals to AND-gates 212, 214 from the PLL macro 140 itself are first synchronized with HFLPO clock output, e.g. 10 MHz clock, by either of two different synchronization circuits 242, 246. Sync circuits 242, 246 are included in the PF 240 for selection of 1-stage and 2-stage synchronization respectively. These two alternative circuits 242, 246 for synchronizing the RFSLIP signal are shown in FIG. 5A and FIG. 5B respectively. Identical circuitries 242' or 246' etc suitably also are provided in the FBSLIP signal pre-filtering circuit PF 240'. A synchronization circuit 242 or 246 for synchronizing the RFSLIP signal is selected by a SLIP_FILTER_KEY field of a register field for clock slip control in register block 118. The synchronization circuit 242' or 246' to be used similarly for the FBSLIP signal is selected by another key field of such register. Programmable counters 262 and 262' in PF 240 and PF 240' are respectively configurable also from another system registers 118 register field holding a value designated SYS_PLL_SLIP_FILTER_COUNT.

In FIG. 5, the improved PLL control logic 130 thus has the remarkable stabilizing circuit 240 inserted or interposed between an AND-gate 212 for RF_Slip and an input of flip-flop 222. In different words, independent duration filterings are remarkably and beneficially imposed on the warning signal path, e.g. between AND-gate 212 and flip-flop 222 and between AND-gate 214 and flip-flop 224. The PLL 140 macro has a first monitoring output line for a reference cycle slip output RFSLIP that signifies the clock PLLCLK frequency is too high, and a second monitoring output line for a Feedback cycle slip output FBSLIP that signifies that PLLCLK frequency is too low. The AND-gate 212 qualifies RF_Slip with a SLIP_DET_VALID qualifier input line that becomes active when the PLL 140 has had sufficient time to stabilize or achieve PLL lock (see discussion of FIG. 10). The control signal SLIP_DET_VALID for AND-gates 212, 214 to gate RFSLIP and FBSLIP goes high after PLL 140 has locked, and SLIP_DET_VALID goes low when PLL 140 is powered down by FSM 280 (finite state machine used as a controller).

D-Flip-flops 222 and 224 have a hard-wired logic one ('1') supplied to their data input and get clocked respectively when their clock input (">") is actuated by PF 240 or PF 240' respectively. Flop 222 is reset when active-low reset nRST goes low or when there is a system write to a status register among registers 118 to clear RFSLIP. Flop 224 is reset when nRST goes low or upon such a system write to a status register to clear FBSLIP. Prefilter circuit 240 is inserted between the output of RFSLIP AND-gate 212 and the clock input of flip-flop 222. Prefilter circuit 240 prevents flip-flop 222 from responding to some instances of RFSLIP temporarily going active.

Notice that if the output of AND-gate 214 were to go directly to the clock input of flip-flop 224, an unfiltered meaningless instance of FBSLIP going active due to ESD could actuate the flip-flop 224. Instead, as indicated by the 'X', prefilter circuit 240' is inserted, introduced or interposed between the output of FBSLIP AND-gate 214 and the clock input of flip-flop 224. Prefilter circuit 240' prevents flip-flop 224 from responding to some instances of RFSLIP temporarily going active and beneficially increases the ESD tolerance.

Such temporary instances of RFSLIP result mostly from ESD conditions and therefore should be and are ignored here. Consequently, occurrences of errors (hereinbelow called Type I errors) at the output RFSLIP from AND-gate 222 are resisted, prevented, or greatly reduced in this embodiment. Furthermore, an OR-gate 226 has inputs respectively fed from the outputs of flip-flops 222 and 224. The output of OR-gate 226 would be activated in case either RFSLIP or FBSLIP goes active. Temporary instances of RFSLIP activation from ESD conditions are prefiltered by circuit 240 and do not reach OR-gate 226. Accordingly, a more nearly error-free output from OR-gate 226 is fed to an AND-gate 228 that, when qualified by another KEY, provides a more error-free monitoring output PLL_SLIP.

In FIG. 5, prefilter or stabilizing circuit 240 has a first synchronizing circuit 242 called SYNC Logic #1, a second synchronizing circuit 246 called SYNC Logic #2, and an output mux 272 having two inputs whereby mux 272 is operable either in a slip filter bypass mode or a slip filter active mode for circuit 240. Circuits 242 and 246, as well as the first input of mux 272, are all fed with RFSLIP output from AND-gate 212. An intermediate mux 252 in PF 240 has respective inputs fed from the outputs of circuits 242 and 246. Mux 252 conveys an output RFSLIP_SYNC to a count/reload control input of an e.g. six-bit downcounter 262. Counter 262 is configured or loaded with a six-bit time duration configuration value designated SYS_PLL_SLIP_FILTER_COUNT from FIG. 3 registers 118. A clock signal HFLPO_CLK clocks the counter 262 down. If the counter 262 reaches zero, it is detected by zero-detection logic 266, whence a detection output designated RFSLIP_FILTERED goes active. The output of detection logic 266 is fed to a second input of mux 272 as well as to a control input STOP of counter 262. In other words, a full down count to zero stops counter 262 and delivers an active high to mux 272. If the slip filter circuit 240 is activated in slip filter active mode, a selection signal causes mux 272 to couple that second input to the clock input of flip-flop 222. Thus, flip-flop 222 is actuated only if counter 262 fully downcounts to zero so that detection output RFSLIP_FILTERED goes active. As described and illustrated in FIG. 5, the circuitry 130 with circuits 210, 240, 290 is made to have programmable tolerance to ESD, and allows the system to fine tune or adjust the ESD sensitivity such as by configuring SYS_PLL_SLIP_FILTER_COUNT in registers 118.

Further in FIG. 5, the mux 272 selector signal is formed by a keyed selection logic circuit 268 that causes mux 272 to select the input receiving RFSLIP_FILTERED unless it is true that both a particular key value called SYS_PLL_SLIP_FILTER_KEY is not a predetermined multibit value as well as that the counter 262 configuration value SYS_PLL_SLIP_FILTER_COUNT is all zeroes.

Counter 262 is thus loaded with a SYS_PLL_SLIP_FILTER_COUNT value and is enabled to count down when some activity in RFSLIP is detected (RFSLIP_SYNC is '1'). Zero detection circuit 266 stops counter 262 when counter 262 reaches zero, and zero detection circuit 266 sets the RFSLIP_FILTERED signal active if RFSLIP_SYNC is still active '1'. The count/reload logic is arranged so that filter counter 262 is reloaded with SYS_PLL_SLIP_FILTER_COUNT whenever the RFSLIP is subsequently de-asserted from the PLL macro 140 and the RFSLIP_SYNC there is at '0'. The RFSLIP_FILTERED signal is allowed to pass through mux 272 only when a predetermined enabling key value is set for logic 268 and the logic circuit 268 senses that SYS_PLL_SLIP_FILTER_COUNT is set to a non-zero value. Otherwise, mux 272 passes the unfiltered RFSLIP signal from AND-gate 212 directly to flip-flop 222. Depending on the number N of bits in the length of counter 262, a filtering duration as many as 2^N cycles of HFLPO_CLK can be used to filter out ESD artifacts from RFSLIP.

A circuit section 290 in FIG. 5 is responsive to a finite state machine FSM 280 that controls applicable Clock Monitor Wrapper 110 circuits such as PLL 140 and provides FSM state information 'STATE info' to a Counter/Disable logic circuit 292 for supporting PLL 140. PLL_VALID_SIG is generated (asserted high) by logic 292 after a wait interval counted off by a counter in circuit 292 to ensure that PLLCLK (also labeled SSWCLK in FIG. 4) is enabled and ready in FIGS. 3, 9 and 10. (The wait interval can be empirically determined and configured or established as a sum of PLL reset time plus PLL lock time plus enable time for the FIG. 9 clock dividers to deliver PLLCLK plus enable time for further circuitry of FIG. 3 block 110 and any other downstream circuitry in the clock chain.) A PLL_VALID output signal goes low when FSM 280 enters a state that powers down PLL 140. A command SWITCH_OFF_SSWCLK from FSM 280 is coupled via an inverter 291 to control the logic 292. Logic 292 provides PLL_VALID_SIG as a validity output signal to the data input of a D-flip flop 298.

In FIG. 5, meanwhile, the improved circuit 210 supplies its error-resistant control signal PLL_SLIP output to the D-input of a flip-flop 294 to synchronize PLL_SLIP with oscillator clock OSCCLK, which clocks both flip-flops 294 and 298. The output of flip-flop 294 is inverted by an inverter 296 which in turn signals the ENABLE input of the flip-flop 298. If control signal PLL_SLIP is inactive (low) or goes low, then flip-flop 298 delivers an output signal PLL_VALID active if or as soon as PLL_VALID_SIG is high on a subsequent rising edge of OSCCLK. Notice that the error-resisting operations of prefilter circuitry 240 cooperate with circuit 210 to cause PLL_SLIP to be desirably inactive low more of the time if and when ESD meaninglessly affects RFSLIP or FBSLIP. Generally speaking, that means the output PLL_VALID from circuit 290 will be active more the time. Output PLL_VALID fans out to qualify any functional circuit to which PLL validity is relevant, which means that in general the functional circuitry 120 will desirably be performing more. Completing the circuit 290 description, flip-flops 294 and 298 are both reset according to a suitable Reset circuits block 299 that provides reset controls. In this example, such reset is supplied either when the system is in Functional Mode by a system reset SYS nRST (3 VCLK cycles delayed) or when the system is in a PMT Mode by a signal nRST to reset the Clock Monitor Wrapper 110 (PLL, SSW area) of FIG. 4.

In FIG. 5A, SYNC Logic #1 (242) has digital logic circuitry that delivers an output pulse RFSLIP_SYNC as follows. The overall operation of SYNC Logic #1 (242) responds to low-to-high RFSLIP input transition to supply a low-to-high RFSLIP_SYNC output transition on the next HFLPO_CLK rising clock edge. See also the upper four (4) waveforms of FIG. 6. The RFSLIP_SYNC output stays high at least one HFLPO_CLK clock period and will persist if the RFSLIP input stays high longer than a clock period. Then the RFSLIP_SYNC output goes low on the next HFLPO_CLK rising clock edge after RFSLIP input goes low. In that digital logic circuitry, a flip-flop 310 has a low-active PreSet input PRE fed by an inverter 312 that is fed by AND-gate 212. An RFSLIP active high from AND-gate 212 sets the output from flip-flop 310 high, which in turn is coupled via a synchronizing flip-flop 320 to circuit output RFSLIP_SYNC as soon as the synchronizing clock HFLPO_CLK transitions high. If circuit 242 output RFSLIP_SYNC goes active, it feeds a qualifying high to a NAND-gate 330, and thus-qualified NAND-gate 330 resets the flip-flop 310 at its Clear input CLR if or as soon as the output RFSLIP from AND-gate 212 is or becomes low. In PF 240', identical SYNC Logic #1 (242') can be analogously described in terms of FBSLIP instead.

In FIG. 5B, for SYNC Logic #2 (246) an RFSLIP high or low from AND-gate 212 is synchronized with HFLPO_CLK by feeding two cascaded D-flipflops 372 and 374 to alternatively produce the RFSLIP_SYNC output to intermediate mux 252 in FIG. 5. See also the lower two (2) waveforms of FIG. 6 for SYNC Logic #2 operations. Synchronizing clock HFLPO_CLK (top waveform in FIG. 6) is fed to the clock input of each of the cascaded D-flipflops 372 and 374. Compared to SYNC Logic #1 in FIG. 5A, SYNC Logic #2 in FIG. 5B has its RFSLIP_SYNC output rising transition one clock period after the rising clock transition that is next after an RFSLIP input rising transition. The RFSLIP_SYNC output falling transition occurs one clock period after the rising clock transition that is next after an RFSLIP input falling transition. Mux 252 delivers a selected type of synchronization from Sync circuit 242 or from 246 depending on whether the Slip Filter Key is a predetermined key value, or not, at the selection input of mux 252. In PF 240', identical SYNC Logic #2 (246') can be described in terms of FBSLIP instead.

Figure 6:
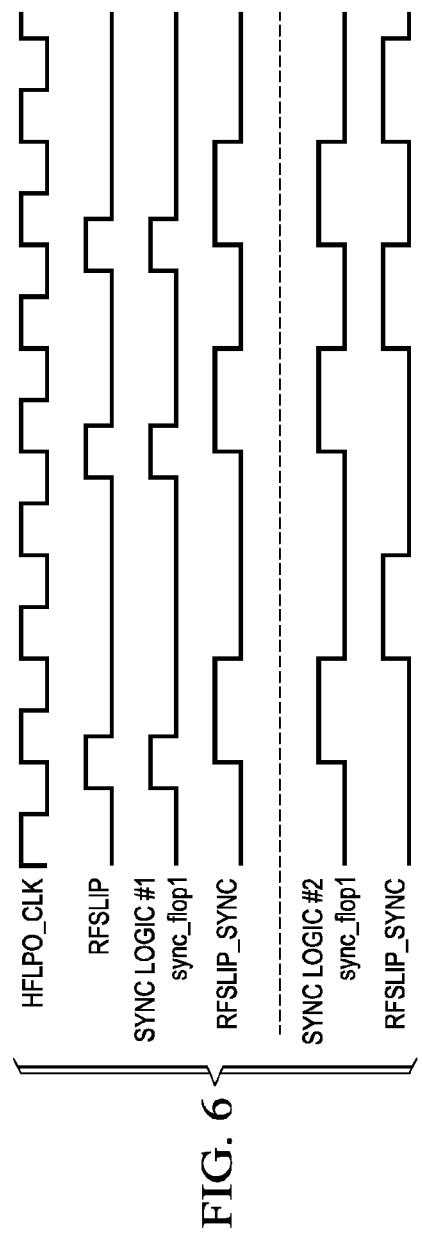
FIG. 6 is a waveform diagram of voltages of digital logic signals versus time in FIGS. 5A and 5B for part of a process embodiment.

FIG. 6 thus compares operations to produce the signal on the FIG. 5 line RFSLIP_SYNC based on the selected FIG. 5A Sync Logic#1 (242) or FIG. 5B Sync Logic#2 (244) as discussed hereinabove.

Figure 7:
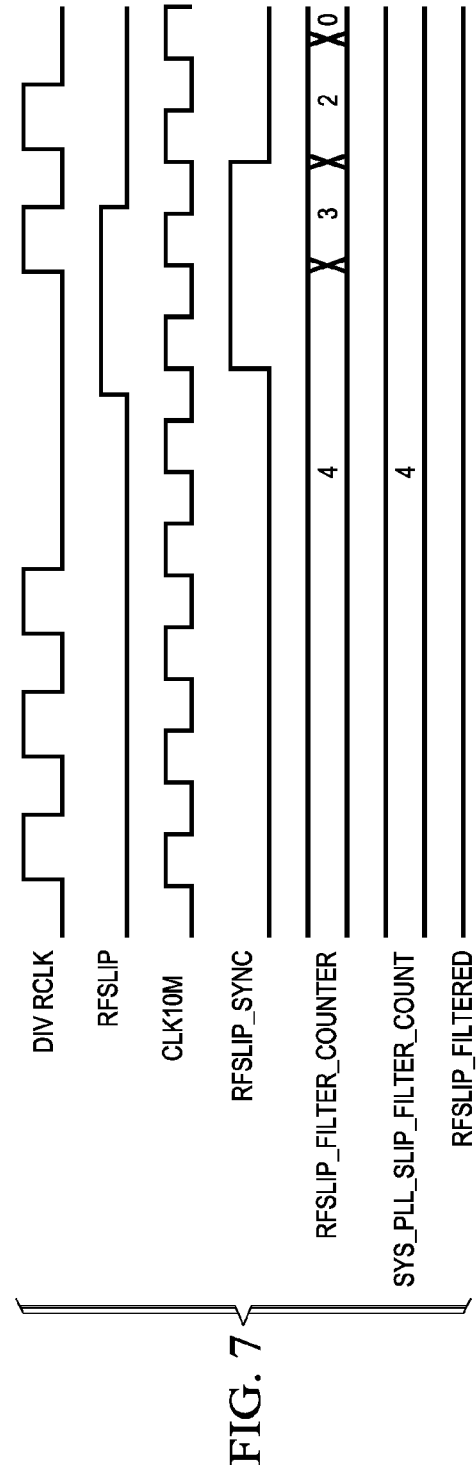
FIG. 7 is a waveform diagram of voltages of digital logic signals versus time in FIG. 5, illustrating a process embodiment of operation on a transient ESD-affected warning signal.

In FIG. 7, RFSLIP_FILTERED behavior at filter PF 240 output is shown for a scenario in which RFSLIP duration is less than filter count SYS_PLL_SLIP_FILTER_COUNT. In this example, mux 252 is set so that circuit PF 240 operation is based on Sync Logic#1 (242). The slip input indication RFSLIP is of short duration even when synchronized as RFSLIP_SYNC. Hence, it is filtered off by the filter circuit PF 240 in FIG. 7. SYS_PLL_SLIP_FILTER_COUNT is configured to a value of, e.g., four (4, binary 0x0100) for convenient illustration in FIG. 7 and may actually be any value the counter 262 width accommodates. As soon as RFSLIP_SYNC goes high at the input of counter 262, the counter 262 is loaded and then decremented at the end of each clock period of CLK10M (HFLPO_CLK). But in FIG. 7, RFSLIP_SYNC goes low before the count can reach zero, so the zero-detector 266 output RFSLIP_FILTERED remains inactive, thus filtering off the unsustained RFSLIP activity.

Figure 8:
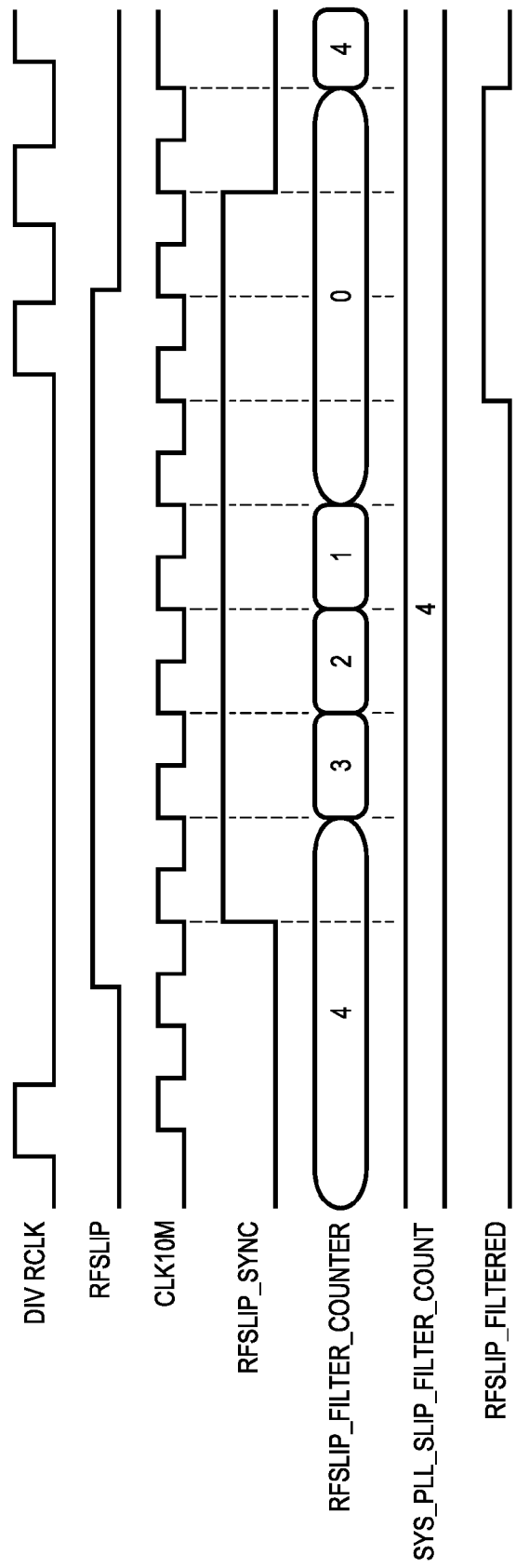
FIG. 8 is a further waveform diagram of voltages of digital logic signals versus time in FIG. 5, illustrating a process embodiment of operation on a sustained warning signal.

In both FIGS. 7 and 8, operations for PF 240' can be described in terms of FBSLIP instead.

In FIG. 8, RFSLIP_FILTERED filter PF 240 output behavior is shown for a scenario in which slip input indication RFSLIP (synchronized as RFSLIP_SYNC) has a duration greater than filter count SYS_PLL_SLIP_FILTER_COUNT. Mux 252 is still set so that circuit PF 240 operation is based on Sync Logic#1 (242). This time, filter circuit PF 240 produces an active output because RFSLIP_SYNC is sufficiently sustained or persistent. Slip indication RFSLIP_SYNC is of longer duration than the pre-programmed filter count value, so the output RFSLIP_FILTERED is asserted. Beforehand, SYS_PLL_SLIP_FILTER_ COUNT and SYS_PLL_SLIP_FILTER_KEY are programmed or configured to desired values in register 118 before enabling the PLL 140.

SYS_PLL_SLIP_FILTER_COUNT is configured to a value of, e.g., four (4), the same as in FIG. 7 simply for illustration.

In FIG. 8, as soon as RFSLIP_SYNC goes high at the input of counter 262, the counter is again loaded and then decremented at the end of each clock period of CLK10M (HFLPO_CLK). The RFSLIP_SYNC high is sustained and persists at least as long and even beyond when the count reaches zero. Then the zero-detector 266 output RFSLIP_FILTERED goes high on the first rising edge of CLK10M (HFLPO_CLK). RFSLIP_FILTERED immediately actuates the STOP input of counter 262. RFSLIP_FILTERED remains high for a non-critical predetermined period, e.g. three (3) clock periods of CLK10M (HFLPO_CLK), whereupon RFSLIP_FILTERED goes low. When RFSLIP_FILTERED goes low, counter 262 is reset to four (4), but is not enabled to down-count until some future instance of RFSLIP_SYNC active is supplied.

Considering FIGS. 5, 7 and 8 together, programmable logic circuitry for programmable ESD tolerance is provided to filter a transient on each slip warning line by eliminating a change of state for the warning over a programmable duration, conferring a programmable tolerance to a transient fault caused by an ESD event. Given the filtering 240 and 240' on each slip warning line RFSLIP and RBSLIP, the downstream logic for PLL slip delivers its output PLL_SLIP as a logic function of the filterings of slip warning lines RBSLIP and RFSLIP jointly. Consequently, that PLL slip downstream logic benefits from and is endowed with programmable tolerance to the transient fault.

Considering FIGS. 3-5 together, two error scenarios can occur in a circuit lacking both PF 240 and PF 240'. In a first error scenario, the PLL did not slip, yet the PLL_SLIP goes active on an ESD event. This PLL_SLIP active should therefore be ignored as in FIG. 7 because the PLL did not slip or slipped only insignificantly. This first type of scenario is called a Type I error herein. Using either or both of PF 240 and PF 240' addresses such Type I errors.

In a second scenario, the PLL did slip in a noteworthy, system-significant way such as that the PLL is seriously losing lock. This slip width should not be ignored. If PLL_SLIP nevertheless did not go active, this second type of scenario would be called a Type II error herein. To avoid such Type II errors or keep them minimal, various embodiments remarkably sense an extended duration of a slip condition, and PLL_SLIP goes active as in FIG. 8 when the slip is long enough. The FIG. 3 mux 116 should switch (e.g., to PLL#2 or to OSC_CLKOUT) and herein is made to switch when the slip is long enough in duration or exceeds a predetermined or configured threshold representing sufficient duration. Detection of sustained slip is represented by filtered FBSLIP and filtered RFSLIP considered jointly by OR-gate 226. Otherwise, the FIG. 5 circuitry 130 maintains its detector state and does not switch when the slip is of a shorter duration that is insufficiently sustained.

FIGS. 3, 4, 5, 9 and 10 show sub-blocks of FIG. 1 clock monitor wrapper 110. PLL 140 is a spread spectrum PLL to multiply an input clock signal by a factor of e.g. as little as unity (1) up to e.g. any selected integer such as three decimal digits or more. (A spread spectrum PLL varies its frequency over about a percent to reduce interference to other devices, ICs or wireless circuits. A configurable parameter, which can be mode-dependent, controls the spread spectrum PLL spreading amount.) The PLL macro 140 also contains a divider '/NR' at the reference clock input RCLK (fed e.g. from FIG. 3 OSC_CLKOUT). An output divider '/OD' associated with PLL 140 divides VCOCLK by some integer if desired. Controls for these dividers are driven in FIG. 4 by SYS or GTM input ports or by a serial PMT pin in a Functional mode, a Test configuration mode, and in a PMT mode respectively. In FIG. 4, a block RCLK_GEN generates a clock based on a configured division value NR to divide down a PLL reference clock RCLK, which uses OSCCLK as its source. Reference clock RCLK can be used as source in a lock period counter in logic 130 for the PLL 140, see also block 292.

FIG. 9 shows a clock and PLL circuit for FIGS. 2-5. Two PLL macros PLL and PLL#2 and configuration registers are suitably provided in one kind of embodiment for a microcontroller as in FIG. 2. Compared to a clock input for a given block in FIG. 9, divides '/NR,' '/OD,' '/R,' '/NR2,' '/OD2,' and '/R2' provide an output for such block at a reduced frequency compared to that clock input. Compared to an internal clock input INTCLK to PLL or INTCLK2 to PLL#2, divide '/NF' or '/NF2' operates to cause an overall frequency multiplication xNF or xNF2 by such phase lock loop working together with the divider. For instance, configuration registers 118 can set PLL2 output divider 'post_ODCLK' frequency to be e.g. 400 MHz, and R-divider to divide the post_ODCLK frequency by e.g. five (/5) to generate a PLL2 output clock (PLL2CLK) of 80 MHz for some of the functional circuitry in block 120. Other divider control values (i.e., divides) can deliver various clock frequencies for selectable clocking e.g., for the FIG. 2 peripherals. For the particular clock path shown in FIG. 9 the output frequencies are given by:

$$f_{PLLCLK} = (f_{OSCIN}/NR) * NF/(OD*R) \quad (1)$$

$$f_{PLL2CLK} = (f_{OSCIN}/NR2) * NF2/(OD2*R2) \quad (2)$$

In FIG. 10, one example of a phase lock loop includes a voltage-controlled oscillator VCO having an output to an output divider 430, such as '/OD' and/or '/R', that goes to a bypass mux 116. VCO output also is fed back to a divider 435 circuit '/NF' that goes to a first input of a phase error detector PD 420. Another divider 440 '/NR' divides a reference clock RCLK if desired, and supplies a divided output to a second input of phase error detector PD. Detector PD 420 responsively generates a phase error output that causes the VCO to reduce the phase error and thereby achieve PLL lock. Detector PD 420 suitably also includes circuits to detect a slip, such as a first threshold detector responsive to a sufficient amount of e.g. positive phase error to generate FBSLIP active, and a second threshold detector responsive to a sufficient magnitude of e.g. negative phase error to generate RFSLIP active. A further counter/logic circuit such as FIG. 5 block 292 associated with detector PD 420 can provide a status signal that goes active if a sufficient period of time has elapsed wherein both FBSLIP and RFSLIP are inactive as well. SLIP_DET_VALID can be derived from such status signal. See also FIG. 5 circuitry 210, 290 for PLL_SLIP or PLL_VALID. Either or both such signals can be used as an input to bypass logic 450 for mux 116 of FIG. 3 or FIG. 10. In FIG. 10, if no other signal of Bypass Control 460 calls for bypass, then the PLL output can be delivered by the mux 116 to destination circuitry 120 in IC 10.

Figure 11:
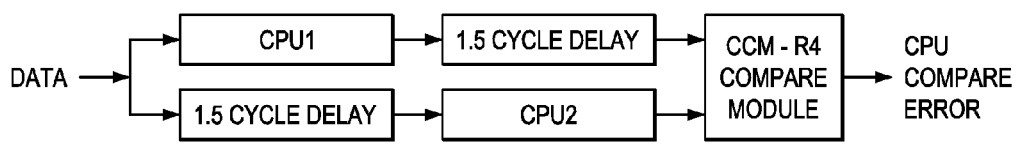
FIG. 11 is a block diagram detailing a two-core checking circuit utilizing processor cores in the SoC of FIG. 2.

In FIG. 11, the functional circuitry 120 of FIG. 2 includes two processor cores CPU1 and CPU2 that run software approximately in parallel in an error checking mode supported by comparator module CCM that can check for discrepancies of operation arising in one CPU but not the other. A pair of 1.5 clock-cycle delay modules, one module on the output of CPU1 and the other module on the input of CPU2, also promote error-checking by comparator module CCM for simultaneously occurring errors arising the FIG. 11 circuit due to an ESD event or external interference.

Figure 12:
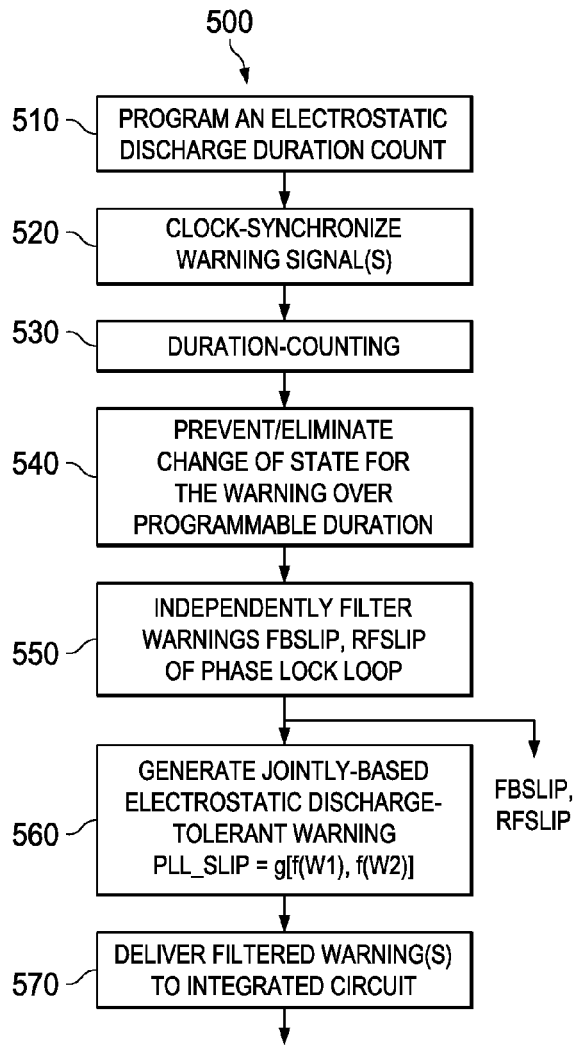
FIG. 12 is a flow diagram of a process embodiment of integrated circuit operation for increased ESD tolerance.

In FIG. 12, a process or method embodiment 500 of integrated circuit operation for increased ESD tolerance is shown. IC 10 of FIG. 1 can issue an internal warning but it can have a sensitivity to an electrostatic discharge (ESD) event. For increased ESD tolerance, the method 500 beneficially imposes filtering on the issuing of the internal warning for at least one instance of an unnecessary warning so as to reduce the sensitivity to the ESD event. The filtering protects e.g., a phase lock loop PLL 140 from delivering an unnecessary slip warning to clock controls for FIG. 3 mux 116 and for protective circuits for functional circuit 120.

In FIG. 12, process 500 begins by a step 510 of programming or configuring an ESD duration count in registers 118. FIG. 5 PLL macro 140 has lines for issuance of distinct internal warning signals. In FIG. 12, a step 520 clock-synchronizes an instance of warning before a duration-counting step 530. In FIG. 5, a selected type of the clock synchronizing 520 is applied to such instances on the respective warning line for RFSLIP or FBSLIP. Next, duration-counting 530 of internal warning activity is performed. Based on the duration counting 530, a succeeding step 540 filters out each insufficiently-prolonged instance of unnecessary warning. Such filtering 540 prevents or eliminates a change of state for the warning, e.g. an over cycle slip RFSLIP or under cycle slip FBSLIP over the programmable duration. Expressed another way, filtering 540 resists an incipient change of state on such warning line over the programmable duration. This confers programmable tolerance to a transient fault caused by an ESD event. Step 550 independently filters the warning lines, such as FBSLIP and RFSLIP of PLL 140. Filtering 550 even includes independently filtering at least two such lines in the overall internal warning path in parallel, e.g. by modules 240, 240'. The designations RFSLIP and FBSLIP are used in multiple places in FIG. 5 and together indicate the warning signal flow and overall internal warning path associated with circuitry 210. A succeeding step 560 generates at least one ESD tolerant warning jointly based on the independent filtering 550, see Equation (3).

$$Wout = g[f_1(W1), f_2(W2)] \quad (3)$$

In Equation (3), the outer function g[ ] combines inputs to produce a warning output Wout according to some function of the inputs jointly. Inner functions $f_1(W1)$ and $f_2(W2)$ represent the filter functions that are impressed on the respective warning lines W1 and W2 in an internal warning path.

$$PLL\_SLIP = f_1(FBSLIP) \text{ OR } f_2(RFSLIP) \quad (4)$$

Equation (4) more specifically represents the FIG. 5 operations and an example of steps 550, 560 wherein modules 240, 240' and their output flip-flops 222, 224 provide respective filtered outputs as a respective function $f_1()$ or $f_2()$ of the inputs RFSLIP, FBSLIP from AND-gates 212, 214. Function g[ ] is represented by OR-gate 226 that has inputs for those respective filtered outputs and combines them according to a logical OR function to generate the combined warning PLL_SLIP. Steps 550, 570 deliver or convey the filtered warnings RFSLIP, FBSLIP, PLL_SLIP to the rest of IC 10 such as circuitry 120.

Figure 13:
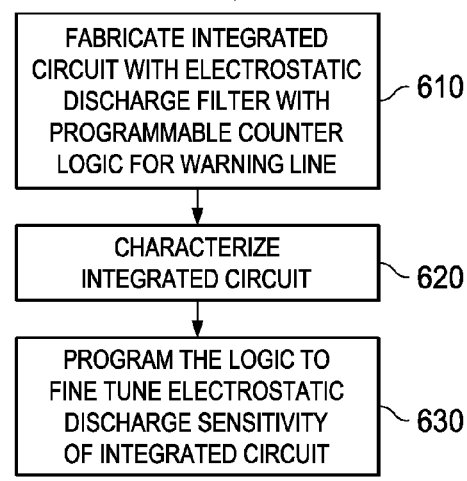
FIG. 13 is a flow diagram of a process embodiment of integrated circuit manufacture for increased ESD tolerance.

In FIG. 13, a process or method embodiment 600 of integrated circuit manufacture for increased ESD tolerance is shown. The integrated circuit is some IC 10 that has an internal warning line between circuits, with sensitivity to an electrostatic discharge (ESD) event. A step 610 fabricates a filter circuit including programmable counter logic for the internal warning line along with the rest of the integrated circuit in a wafer fab facility.

A step 620 characterizes the integrated circuit such as by ESD testing and/or other testing. Such characterization may occur before or after packaging, and appropriate tests are suitably performed both at a wafer fab and later at a packaging assembly/test facility or elsewhere.

Further in FIG. 13, a step 630 fine tunes or adjusts the ESD sensitivity of IC 10 by programming the programmable counter logic after the integrated circuit is characterized either in die or packaged form. For instance, the adjusting or fine-tuning suitably is performed on initial IC samples, and may subsequently be verified and further adjusted based on integrated circuits (wafer or dice) from one or more production lots. Testing such as described hereinabove for FIG. 1 introduces ESD events or other interference events into IC 10.

Tests of the filtered warnings are made, such as on RFSLIP, FBSLIP, PLL_SLIP in a condition of PLL lock, to establish a filter count value e.g. for SYS_PLL_SLIP_FILTER_COUNT to configure into the good IC dice from that lot. That value is suitably established to represent a long-enough duration to encompass the duration of most or all insignificant warning occurrences due to ESD/interference events while still short enough in duration to pass valid warnings of PLL slip occurrences or slip durations that should initiate protective measures such as application restart, warm reset, hard restart, or otherwise. In FIG. 5, the mux 272 in the filtering or reconstituting circuit provides a bypass mode '0' and an active mode '1', and testing can optimize the count and verify that at least one type of warning error on the internal warning lines in an overall warning path is reduced in the slip filter active mode compared to a slip filter bypass mode. Configuration can be applied to e-fuses, OTP (one-time programmable) memory, flash memory, to a flash patch, or otherwise suitably. Some embodiments can include chip-specific BIST (built in self test) circuitry that executes the fine-tuning and configuration automatically on-chip.

The effectiveness of an embodiment including such stabilizing circuitry can be measured, optimized or tested by metrics of reliability in terms of percentages of Type I and Type II errors each categorized by type of ESD immunity test. For example, suppose hypothetically for every 100 ESD events applied on a test to IC 10 in slip filter bypass mode (Mux 272='0') for which the PLL did not slip in its actual timing, that eight occurrences of activation of detection signal PLL_SLIP are observed. Then the corresponding Type I error rate would be 8%. Conversely, suppose hypothetically for every 100 ESD events similarly applied on test to the same IC in slip filter bypass mode (Mux 272='0') for which the PLL actually slipped in its timing, that 97 occurrences of activation of detection signal PLL_Slip are observed. Then the Type II error rate would be 3% (100-97)/100. (It is emphasized these are hypothetical percentages scaled to show the concepts only.)

An ESD Slip Rate is also useful for assessing the operations of the device under test (DUT). For example, suppose for every 1000 ESD events, it is contemporaneously and hypothetically observed in 710/1000 of them that the PLL does not actually slip and in 290/1000 of them the PLL does actually slip. Then the estimated probabilities or frequencies of occurrence of Type I and Type II errors would be the respective products p(Type I)=0.71×8%=5.7% and p(Type II)=0.29×3%=0.9%. Again, it is emphasized that these example values are offered illustratively to facilitate intelligent configuration, testing and evaluation, and these values do not represent actual measurements of any actual IC, product or system. In practice, actual measured values will depend on particular specified ESD test conditions, particular IC physical designs, internal IC circuitry designs, printed wiring board (PWB) physical and circuit designs, and overall system designs.

After the above testing, then the testing would switch to slip filter active mode (Mux 272='1') and measure the Type I and Type II error data to optimize parameters and verify when Type I error rate is reduced and Type II error rate is not increased.

Notice that Type I errors unnecessarily reduce the performance when the PLL did not slip, and the Type II errors represent an un-remedied risk of poor performance when the PLL does slip. Accordingly, the manufacturer can establish a configuration strategy for making a given embodiment at least approximately establish the configured duration for the prefiltering circuit so that the probabilities p(Type I) and p(Type II) are more nearly reduced or optimized, while taking the consequences of each type of error into account. For example, suppose observations indicate that lengthening the configured duration in the prefiltering circuit can substantially reduce the Type I errors without increasing the Type II errors, then such lengthened duration is desirably adopted to an extent directed toward minimizing the Type I errors. On the other hand, if at some extent of increasing such configured duration, the Type II errors substantially increase and these Type II errors significantly impact the particular system, then the configured duration should probably not be increased to that extent and the duration may be directed toward balancing or otherwise judiciously establishing the probabilities of errors rather than pure minimization of Type I errors.

Also, to the extent that the effect of the ESD condition on, e.g., the PLL_SLIP signal can be more or less accurately understood as to duration, the configured duration can be estimated and initially established to reduce the number of iterative adjustments. For example, if triggering oscilloscope observations indicate that most of the ESD-caused activity durations of PLL_Slip are less than a given duration value in a Type I scenario, then that duration value is suitably adopted for the configured duration.

In view of the description herein as a whole, additional variants or alternative embodiments are readily prepared to fully realize a variety of operations for electronic circuit monitoring and protection based on the teachings herein. For instance, one or the other of PF 240 and 240' might be omitted in some embodiments. In PF 240 or 240' or both, counter 262 can be arranged for up-counting from zero, and block 266 can be replaced by a comparator that compares to the configured value SYS_PLL_SLIP_FILTER_COUNT rather than down-counting to zero. In some embodiments, one of the SYNC logic circuits 242 or 244 might be omitted, and/or one or both muxes 252 and 272 might be omitted.

The particular PLL macro(s) may be more or less complex and, depending on the PLL structure and layout adopted and other particulars of the PLL and the integrated circuit and of ESD or interference under consideration, may call for some variant embodiment that can be readily provided based on the teachings and description of the embodiments disclosed herein. To resist ESD and interference, a pre-filter like PF 240 can be added in some integrated circuit embodiments on control input warning lines to, or status warning output lines from, other types of blocks besides PLL circuits. Also, in some integrated circuits, different parts of the IC 10 might not always be coupled with each other by a given line along which the status, warning, or other ESD-sensitive signaling occurs, and nevertheless the circuit parts are operationally at least sometimes coupled with each other and would be subject to some of the sensitivity that is here ameliorated.

Notice also that PF 240 can be viewed either as a circuit that filters an ESD-affected signal, or as a circuit that reconstitutes what would otherwise have been a continual inactive level of RFSLIP from AND-gate 212 if it had not been for a brief disturbance somewhere in the upstream circuitry due to ESD. In some embodiments, analogous protection can be provided to reconstitute or sustain an active warning level with which an ESD event could interfere, and in general the configured count value for the latter protection could be different from the value configured for SYS_PLL_SLIP_FILTER_COUNT. For instance, additional logic in SYNC logic 242 or 244 or the like can be provided in PF 240 or 240' or both, e.g., by providing another counter with logic to eliminate a temporary high-low-high interruption in RFSLIP from PLL macro 140 if such is observed on an ESD event. In still other embodiments additional circuitry 269 is or can be included to temporarily reconstitute clock pulses in an ESD-disturbed series of clock pulses, or some ESD-disturbed sequence of predetermined logic levels elsewhere by generating a continuation of the sequence based on pre-existing knowledge about the sequence or by logic that temporarily holds and replays an earlier part of the pre-existing sequence into the affected warning line as needed. Such additional reconstituting circuitry is suitably made responsive to a control analogous to RFSLIP_FILTERED supplied to initiate remedial action for the particular signal-reconstituting purpose. Viewed in this light, the line RFSLIP_FILTERED is a special case in which reconstituting circuitry 269 is a single line that ordinarily stays low (inactive).

For instance, this solution is applicable any electronic circuit comprising at least two parts of the circuit with an internal warning path between them and the circuit having a sensitivity to an electrostatic discharge (ESD) event. A reconstituting circuit is interposed in the internal warning path and operable to at least temporarily reconstitute a pre-existing signal condition at an output of the circuit onto the internal warning path when a departure from that pre-existing signal condition is sensed at an input of the circuit from the internal warning path. The reconstituting circuit is operable to prolong the pre-existing signal condition at its output for a programmable duration generally encompassing a disturbance on the internal warning path resulting from the sensitivity to an ESD event.

Some embodiments are used with one or more microprocessors, each microprocessor having a pipeline is selected from the group consisting of 1) reduced instruction set computing (RISC), 2) digital signal processing (DSP), 3) complex instruction set computing (CISC), 4) superscalar, 5) skewed pipelines, 6) in-order, 7) out-of-order, 8) very long instruction word (VLIW), 9) single instruction multiple data (SIMD), 10) multiple instruction multiple data (MIMD), 11) multiple-core using any one or more of the foregoing, and 12) microcontroller pipelines, control peripherals, and other micro-control blocks using any one or more of the foregoing. Some other embodiments lack a microprocessor.

In FIG. 14, a mobile electronic device embodiment 700 provides increased ESD tolerance to ESD events 40Z (much magnified in illustration) from a user's own body that can impinge upon a microprocessor 710 entering via I/O (input/output) connectors and circuits, voltage Vss supply connectors and circuits, keyboard KBD 720, or display 730. As detailed in e.g. FIGS. 3-10, microprocessor 710 as one kind of IC 10 cooperates even more reliably with mobile handheld circuitry such as I/O, Vss, KBD and display that are coupled and associated with microprocessor 710.

FIG. 15 is a partially-pictorial, partially-block diagram of a vehicle electronic system embodiment 800 for increased ESD tolerance as further detailed in the other Figures. A microcontroller IC 810 such as in FIG. 2 is part of a controller area network (CAN) 820 subject to ESD 40Z from ignition system voltages, engine operations, tire static, etc. As detailed in e.g. FIGS. 3-10, microprocessor 810 as one kind of IC 100 has increased ESD tolerance so it can cooperate and perform even more reliably with CAN 820 circuitry such as I/O, Vss, vehicle ground GND, and control lines to various automotive subsystems that are coupled and associated with microprocessor 810.

Various embodiments are implemented in any integrated circuit manufacturing process such as different types of CMOS (complementary metal oxide semiconductor), SOI (silicon on insulator), SiGe (silicon germanium), organic transistors, and with various types of transistors such as single-gate and multiple-gate (MUGFET) field effect transistors, and with single-electron transistors, and other nanoelectronics and other structures. Photonic integrated circuit blocks, components, and interconnects are also suitably applied in various embodiments.

A few preferred embodiments have been described in detail hereinabove. It is to be understood that the scope of the invention comprehends embodiments different from those described, as well as described embodiments, yet within the inventive scope. Microprocessor and microcomputer are synonymous herein. Processing circuitry comprehends digital, analog and mixed signal (digital/analog) integrated circuits, ASIC circuits, PALs, PLAs, decoders, memories, non-software based processors, microcontrollers and other circuitry, and digital computers including microprocessors and microcomputers of any architecture, or combinations thereof. Internal and external couplings and connections can be ohmic, capacitive, inductive, photonic, and direct or indirect via intervening circuits or otherwise as desirable. Implementation is contemplated in discrete components or fully integrated circuits in any materials family and combinations thereof. Various embodiments of the invention employ hardware, software or firmware. Process diagrams and block diagrams herein are representative of flows and/or structures for operations of any embodiments whether of hardware, software, or firmware, and processes of manufacture thereof.

While this invention has been described with reference to illustrative embodiments, this description is not to be construed in a limiting sense. Various modifications and combinations of the illustrative embodiments, as well as other embodiments of the invention may be made. The terms "including", "includes", "having", "has", "with", or variants thereof are used in the detailed description and/or the claims to denote non-exhaustive inclusion in a manner similar to the term "comprising". It is therefore contemplated that the appended claims and their equivalents cover any such embodiments, modifications, and embodiments as fall within the true scope of the invention.

What is claimed is:

1. An electronic circuit comprising:
   an oscillator circuit arranged to produce a first clock signal;
   a phase lock loop (PLL) circuit coupled to receive the first clock signal and produce a PLL clock signal;
   a PLL slip circuit configured to produce a PLL slip warning signal when the PLL clock signal is not synchronized with the first clock signal; and
   a multiplex circuit arranged to produce one of the first clock signal and the PLL clock signal in response to the PLL slip warning signal.

2. The electronic circuit of claim 1, wherein a loss of synchronization between the PLL clock signal and the first clock signal is due to an electrostatic discharge.

3. The electronic circuit of claim 1, comprising a filter circuit coupled to receive the PLL slip warning signal and produce a PLL slip signal when the PLL slip warning signal remains active for a plurality of cycles of a second clock signal.

4. The electronic circuit of claim 3, wherein the PLL slip signal is applied to the multiplex circuit to select said one of the first clock signal and the PLL clock signal.

5. The electronic circuit of claim 3, wherein the filter circuit comprises a counter to determine a number of the plurality of cycles.

6. The electronic circuit of claim 3 wherein the filter circuit is arranged to prevent a PLL slip warning signal from producing a PLL slip signal in response to a temporary loss of synchronization between the PLL clock signal and the first clock signal.

7. The electronic circuit of claim 1, wherein the PLL slip warning signal comprises a first PLL slip warning signal when the PLL clock signal frequency is too high, and a second PLL slip warning signal when the PLL clock signal frequency is too low.

8. An electronic circuit comprising:
   an oscillator circuit arranged to produce a first clock signal;
   a phase lock loop (PLL) circuit coupled to receive the first clock signal and produce a PLL clock signal;
   a PLL slip circuit configured to produce a PLL slip warning signal when the PLL clock signal is not synchronized with the first clock signal;
   a filter circuit coupled to receive the PLL slip warning signal and produce a PLL slip signal when the PLL slip warning signal remains active for a plurality of cycles of a second clock signal.

9. The electronic circuit of claim 8, wherein a loss of synchronization between the PLL clock signal and the first clock signal is due to an electrostatic discharge.

10. The electronic circuit of claim 8, comprising a multiplex circuit, wherein the PLL slip signal is applied to the multiplex circuit to select said one of the first clock signal and the PLL clock signal.

11. The electronic circuit of claim 8, wherein the filter circuit comprises a counter to determine a number of the plurality of cycles.

12. The electronic circuit of claim 11, comprising a detector circuit to produce the PLL slip signal in responsive to a state of the counter.

13. The electronic circuit of claim 8, wherein the filter circuit is arranged to prevent a PLL slip warning signal from producing a PLL slip signal in response to a temporary loss of synchronization between the PLL clock signal and the first clock signal.

14. The electronic circuit of claim 8, wherein the PLL slip warning signal comprises a first PLL slip warning signal when the PLL clock signal frequency is too high, and a second PLL slip warning signal when the PLL clock signal frequency is too low.

15. An electronic circuit comprising:
   an oscillator circuit arranged to produce a first clock signal;
   a phase lock loop (PLL) circuit coupled to receive the first clock signal and produce a PLL clock signal;
   a PLL slip circuit configured to produce a first PLL slip warning signal when the PLL clock signal frequency is too high, and configured to produce a second PLL slip warning signal when the PLL clock signal frequency is too low;
   wherein one of the first and second PLL slip warning signals produces a PLL slip signal when said one of the first and second PLL slip warning signals remains active for a plurality of cycles of a second clock signal.

16. An electronic circuit comprising:
   an oscillator circuit arranged to produce a first clock signal;
   a phase lock loop (PLL) circuit coupled to receive the first clock signal and produce a PLL clock signal;
   a PLL slip circuit configured to produce a first PLL slip warning signal when the PLL clock signal frequency is too high, and configured to produce a second PLL slip warning signal when the PLL clock signal frequency is too low; and a multiplex circuit, wherein the PLL slip signal is applied to the multiplex circuit to select said one of the first clock signal and the PLL clock signal.

* * * * *